United States Patent

[11] 3,610,949

[72] Inventor Dietrich Armgarth
Dresden, Germany

[21] Appl. No. 20,952

[22] Filed Mar. 19, 1970

[45] Patented Oct. 5, 1971

[73] Assignee Arbeitsstelle fur Molekularelektronik
Dresden, Germany

[54] CIRCUIT FOR PERFORMING LOGIC FUNCTIONS

4 Claims, 2 Drawing Figs.

[52] U.S. Cl. .......... 307/203, 307/207, 307/213, 307/313, 317/235 D, 317/235 X

[51] Int. Cl. .......... H03k 19/08

[50] Field of Search .......... 307/203, 207, 215, 218, 213, 255, 313; 317/235 (22)

[56] References Cited

UNITED STATES PATENTS

| | | | |
|---|---|---|---|
| 3,209,214 | 9/1965 | Murphy et al. ............ | 307/203 X |
| 3,238,386 | 3/1966 | Schaffner ............ | 307/203 X |

*Primary Examiner*—Donald D. Forrer
*Assistant Examiner*—John Zazworsky
*Attorney*—Nolte and Nolte

ABSTRACT: This disclosure relates in general to a circuit for performing logic functions, and more in particular to a logic solid-state integrated circuit.

INVENTOR
DIETRICH ARMGARTH

BY

Nolte & Nolte.
ATTORNEY

CIRCUIT FOR PERFORMING LOGIC FUNCTIONS

Among numerous known logic circuits, there are only a few which can be built up of a small number of components and have good electrical characteristics, such as high noise immunity, low propogation delay, low power dissipation, etc., and which can advantageously be fabricated by integrated circuit techniques. For example, a circuit for performing logic functions has been devised using transistors in grounded-emitter configuration connected in parallel. In this circuit an input is connected to the base of each transistor, the supply voltage is applied through a common load resistor to a junction point, the collectors are connected together to the same junction point, and one or more forward-biased, series-connected coupling diodes are connected between said junction point and each of the parallel-connected outputs. In an alternative version of this circuit arrangement the coupling diodes are bypassed by one or more reverse-biased diodes.

The disadvantage of the aforesaid known circuits is, however, that their propagation delays are comparatively high.

Furthermore, it is known to employ a multiple emitter transistor as the output of such circuits in such a way that the collector of this multiple emitter transistor is connected to the junction point, i.e., the common collector point of all input transistors. In this arrangement, a supply voltage is applied through a resistor to the base of the multiple emitter transistor, and an output is connected to each emitter of the multiple emitter transistor.

The high propagation delays typical for the previously mentioned circuits having coupling diodes at their outputs are reduced in the latter circuits, if the multiple emitter transistor has a sufficiently high inverse current gain. A disadvantage is, however, that there are stringent technological requirements involved in the production of such circuits by integrated circuit techniques.

Another disadvantage of the known circuits, when produced by integrated circuit techniques, is that a separated isolated region is required for each component and therefore usable space is wasted on the semiconductor chip, particularly, when circuits composed of a great number of components are to be produced.

It is therefore the primary object of this invention to provide means for overcoming the above mentioned problems and to provide a solid-state integrated circuit for performing logic functions which contains a much smaller number of isolated regions than known circuits and is consequently capable of being produced on a smaller chip area.

In particular, the purpose of this invention is to develop a logic circuit with low propagation delay, low power dissipation and high noise immunity, in which the input transistors are connected in grounded-emitter configuration and in parallel, the supply voltage is applied through a common load resistor to a junction point, and the collectors of said input transistors are connected to the same junction point.

According to this invention, the above problems have been solved by providing a circuit in which a separate resistor is connected between the parallel-connected collectors of the input transistors, i.e., the junction point, and each circuit output. The terminals of the resistors connected to the junction point are also connected to the bases of the corresponding output transistors, and the other resistor terminals are connected to the emitters of the corresponding output transistors. The collectors of the output transistors are grounded, and the output transistors and input transistors are of complementary type.

In this circuit, current hogging due to subsequent load circuits is avoided and a fast recharging of the load transistors during the switching operation is achieved, thereby resulting in small propagation delays.

This invention will now be explained in greater detail in conjunction with a practical example and the accompanying drawings wherein.

Figure 1:
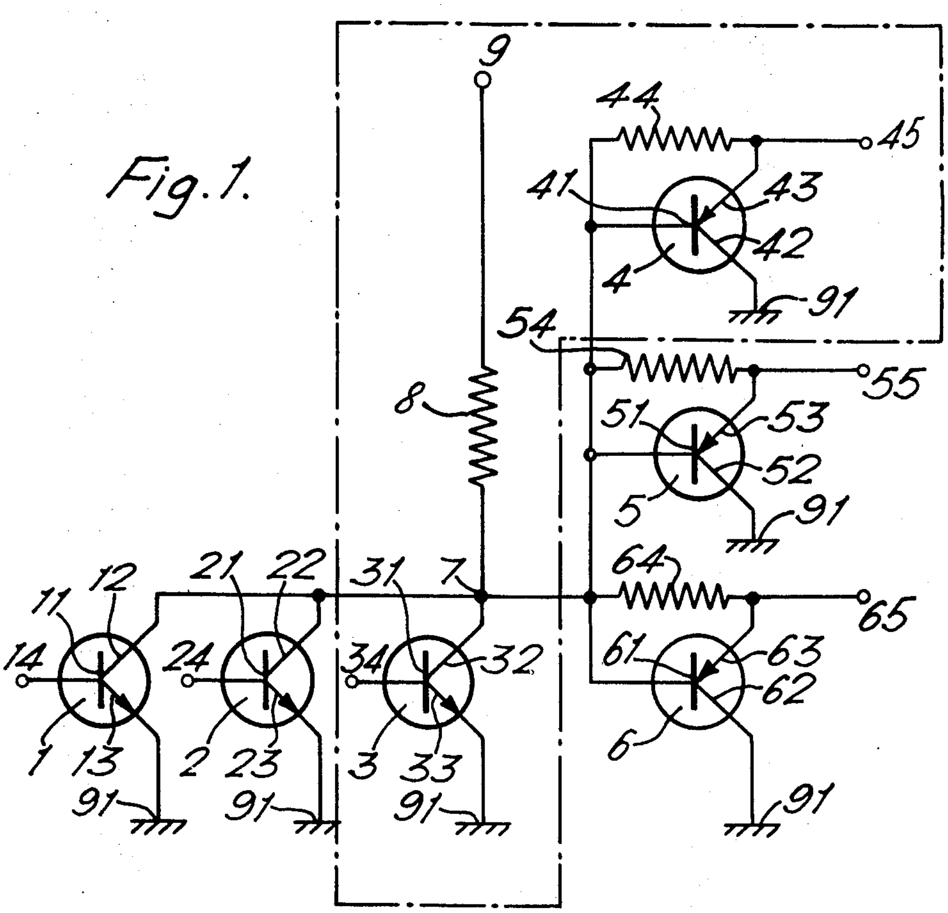
FIG. 1 is a schematic diagram of a circuit according to the invention.

As shown in FIG. 1, inputs 14, 24 and 34 lead to the bases 11, 21 and 31 of input transistors 1, 2 and 3. The emitters 13, 23 and 33 of the input transistors are connected to ground 91, and their collectors 12, 22 and 32 are connected to a common junction point 7. The supply voltage 9 is applied to the junction point 7 by way of the load resistor 8. A terminal of each resistor 44, 54 and 64 as well as the bases 41, 51 and 61 of output transistors 4, 5 and 6 are also connected to the junction point 7. The other terminals of the resistors 44, 54 and 64 are connected to the output terminals 45, 55 and 65, and these output terminals are also connected to the emitters 43, 53 and 63, respectively, of said output transistors. The collectors 42, 52 and 62 of the output transistors are connected to ground 91.

Figure 2:
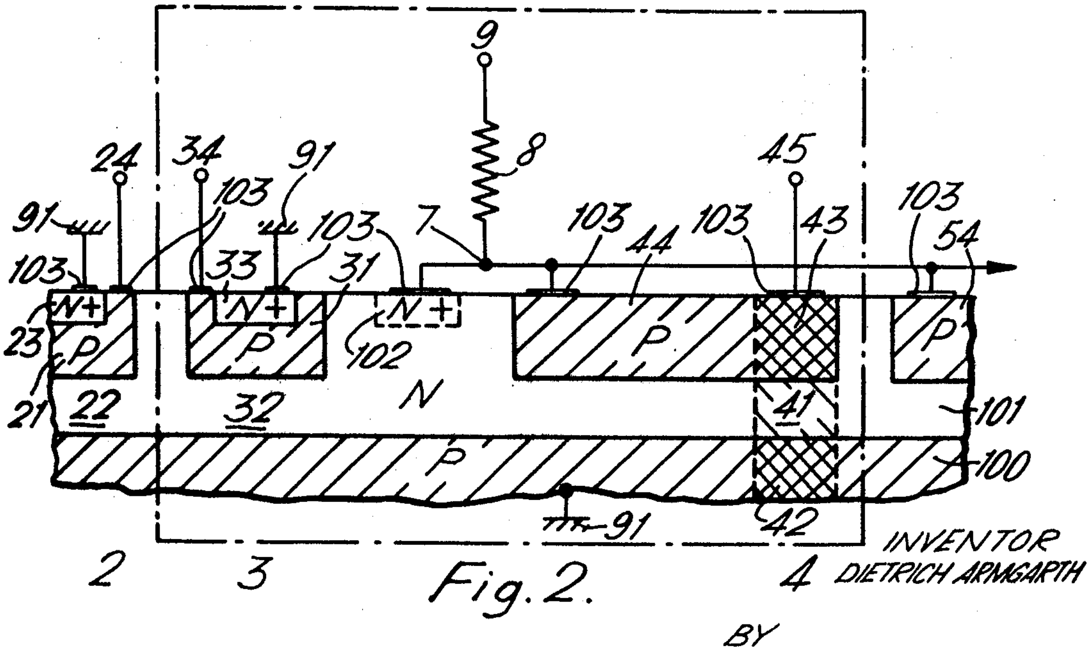
FIG. 2 shows, in cross section, the circuit arrangement of FIG. 1 in an integrated form of construction, with the portion within the dot-dash block corresponding to the portion of the circuit in FIG. 1 within the dot-dash block.

According to FIG. 2, which shows the part of FIG. 1 that is within the dashed-dotted block as well as the adjoining circuit components in the integrated form of construction, an N-type epitaxial layer 101 is deposited on the entire area of a P-type substrate 100 connected to ground 91. The epitaxial layer 101 is effective as the collectors 12, 22 and 32 of the input transistors 1, 2 and 3 and simultaneously functions as the bases 41, 51 and 61 of the output transistors 4, 5 and 6. The P-type base regions 11, 21 and 31 of the input transistors 1, 2 and 3 as well as the P-type resistors 44, 54 and 64 are formed in the epitaxial layer in the known manner. Furthermore, $N^+$-type emitter regions 13, 23 and 33 of the input transistors 1, 2 and 3 are formed in the base regions 11, 21 and 31, and a highly doped $N^+$-type region 102 that serves for known purposes is formed in the N-type epitaxial layer 101. The electrically e effective regions of the integrated circuit are provided in the known manner with contacts 103 for the interconnection of the circuit components. According to FIG. 1, this interconnection is made so that the emitter regions 13, 23 and 33 are connected to ground 91 and the base regions 11, 21 and 31 are connected to the inputs 14, 24 and 34. The highly doped $N^+$-region 102 is connected to one terminal of each resistor 44, 54 and 64 as well as to one terminal of the load resistor 8. The second terminals of said resistors 44, 54 and 64 are connected to the corresponding outputs 45, 55 and 65, and the second terminal of resistor 8 is connected to supply voltage terminal 9.

Below the contact 103 connected to output 45, functional regions, the shape of which cannot exactly be demarcated and is therefore only schematically shown in FIG. 2, are located in such a way that the cross-shaded regions in the P-type zone 44 act as emitter 43, the single-shaded region in the N-type zone 101 acts as base 41, and the cross-shaded region in the P-type substrate 100 is effective as collector 42. Similar functional regions are located below the contacts 103 that lead to the outputs 55 and 65 attached to the resistors 54 and 64 (not shown in FIG. 2). Furthermore, a number of the aforesaid components are not shown in FIG. 2 for the sake of clarity since they are arranged outside the partial section of the functional block. Such unillustrated components, however, are fabricated in the same manner as the illustrated components.

The numbers 2, 3 and 4 at the bottom of FIG. 2 indicate the approximate positions of the corresponding components.

The figures clearly show that the input transistors 1, 2 and 3 and the output transistors 4, 5 and 6 are complementary transistors, the first being of NPN-type and the second of PNP-type. It is, of course, also possible to provide PNP input transistors and NPN output transistors without deviating from the principle of this invention. Moreover, this invention covers, of course, such an arrangement of this circuit in which the input transistors and the resistors including their functional regions that act as output transistors are arranged one behind the other, i.e., normal to the drawing plane, instead of being arranged side by side as shown, for the sake of clearness, in FIG. 2.

The load resistor 8, which in FIG. 2 is shown to be outside the semiconductor block, can be formed either by means of the N-type epitaxial layer 101 or by a further isolated region, but these embodiments of the invention are not shown in the figure.

The advantage of the circuit according to this invention is that only one isolated region is required for the entire integrated circuit shown in FIG. 1. Technologically, this results in a reduced number of fabrication steps and a much better utilization of the space on the semiconductor wafer. Another advantage is that the resistors 44, 54 and 64 and therefore also the output transistors are created simultaneously with the P-type base regions 11, 21 and 31.

The circuit according to this invention performs the NOR function, if the most positive voltage is defined as the 1 signal and the saturation voltage of the transistors 1, 2 and 3 as the 0 signal.

If a 1 signal is applied to one of the inputs 14, 24 or 34, then the corresponding input transistor is made conductive and therefore the voltage between the junction point 7 and ground 91 is equal to the saturation voltage of this transistor. This saturation voltage is also present between the outputs 45, 55, 65 and ground 91. Consequently, a subsequent load circuit of the same kind will reliably be in its OFF state because the saturation voltage is only about 0.15 v. which is lower than the required voltage, 0.7 v., for turning a transistor ON.

If an 0 signal is present at all of the inputs 14, 24 and 34, the transistors 1, 2 and 3 are OFF. In this case the input transistor of a load circuit can be made ON because a current can flow from the positive terminal 9 of a battery (not shown in the figure) through the load resistor 8 and the output resistor 44 to the output 45, and thence into the base of the input transistor of a load circuit. The output resistors 44, 54 and 64 are employed for linearization of the input characteristics of the subsequent load circuits.

If one of the transistors 1, 2 or 3 is now turned ON again, then the transistor of the subsequent load circuit has to be turned OFF which must occur very rapidly, i.e., the charge stored in this transistor must rapidly be removed. The recharging is performed on the one hand through the resistors 44, 54 and 64, and on the other hand by the PNP transistors 43, 53 and 63, which are effective at the changeover moment. A part of the stored charge can flow off to ground 91. Both recharging processes cause the transistors of the subsequent load circuits to be rapidly switched.

What we claim is:

1. In a circuit for performing logic functions using a plurality of input transistors in grounded-emitter configuration connected in parallel, wherein each base of said input transistors is connected to a s separate input, the supply voltage of said input transistors is applied through a common load resistor to a junction point, and the collectors of said input transistors are connected together to said junction point and wherein said circuit has a plurality of output terminals; the improvement comprising a plurality of output resistors, a plurality of output transistors of opposite conductivity type as compared with said input transistors, one terminal of each said output resistor being connected to said junction point and to the bases of said output transistors, the other terminal of each said output resistor being connected to a separate output terminal and to the emitter of a separate output transistor, and means connecting the collectors of said output transistors to ground.

2. A circuit for performing logic functions comprising a plurality of input transistors, a plurality of output transistors of a conductivity type opposite to that of said input transistors, first and second operating source terminals, common first resistor means connecting the collectors of said input transistors and the bases of the output transistors to said first terminal, the emitters of said input transistors and the collectors of said output transistors being connected to said second terminal, a separate input terminal connected to the base of each input transistor, a separate output terminal connected to the emitter of each output terminal, and a separate second resistor connected between the emitter and base of each output transistor.

3. The circuit of claim 2 wherein said second terminal comprises a first semiconductive layer of one conductivity type, the collectors of said input transistors and the bases of said output transistors comprise a semiconductive layer of opposite conductivity type on said first layer, and said second resistors comprise separate semiconductive regions of said one conductivity type formed in said second layer, whereby said separate regions and said first layer further function as the emitters and collectors respectively of said output transistors.

4. The circuit of claim 3 wherein the bases of said input transistors comprise separate semiconductive regions of said one conductivity type formed in said second layer.